United States Patent [19]
Schubert

[11] Patent Number: 4,758,530
[45] Date of Patent: Jul. 19, 1988

[54] DOUBLY-SELF-ALIGNED HOLE-WITHIN-A-HOLE STRUCTURE IN SEMICONDUCTOR FABRICATION INVOLVING A DOUBLE LOCOS PROCESS ALIGNED WITH SIDEWALL SPACERS

[75] Inventor: Peter J. Schubert, Kokomo, Ind.

[73] Assignee: Delco Electronics Corporation, Kokomo, Ind.

[21] Appl. No.: 939,078

[22] Filed: Dec. 8, 1986

[51] Int. Cl.⁴ ............................................. H01L 21/76
[52] U.S. Cl. ...................................... 437/69; 437/73; 437/89; 437/238
[58] Field of Search .................... 29/576 W, 576 E; 148/DIG. 117; 156/643, 653, 657; 357/49; 427/93, 94; 437/69, 73, 89, 238, 239

[56] References Cited

U.S. PATENT DOCUMENTS

| 4,292,156 | 9/1981 | Matsumato et al. | 427/93 |
| 4,361,600 | 11/1982 | Brown | 427/94 |
| 4,583,281 | 4/1986 | Ghezza et al. | 427/93 |
| 4,635,344 | 1/1987 | Havemann | 427/93 |
| 4,657,630 | 4/1987 | Agatsuma | 156/653 |

FOREIGN PATENT DOCUMENTS

| 0043744 | 4/1981 | Japan | 427/94 |
| 0027543 | 2/1984 | Japan | 29/576 W |
| 0094843 | 5/1984 | Japan | 29/576 W |
| 0224141 | 12/1984 | Japan | 29/576 W |
| 0149149 | 8/1985 | Japan | 29/576 W |

Primary Examiner—Brian E. Hearn
Assistant Examiner—Kevin McAndrews
Attorney, Agent, or Firm—Robert J. Wallace

[57] ABSTRACT

A method of fabricating a self-aligned hole-within-a-hole structure which resolves the smaller hole at small dimensions by using a single photolithography step to define the two holes, the step being performed on a planar surface. The method comprises fabricating a block on a substrate having the dimension of the smaller hole, fabricating a sidewall spacer on the block such that the spacer and the block have the dimension of the larger hole, growing a first layer surrounding the sidewall spacer, removing the sidewall spacer, growing a second layer surrounding the block which is thinner than the first layer, and removing the block.

7 Claims, 2 Drawing Sheets

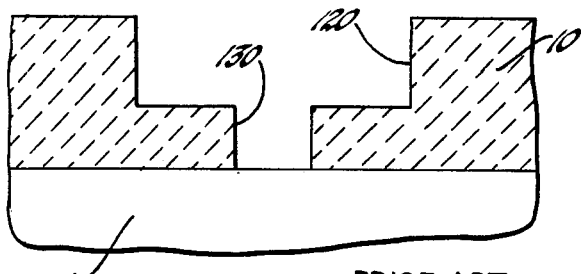
Fig. 1 PRIOR ART
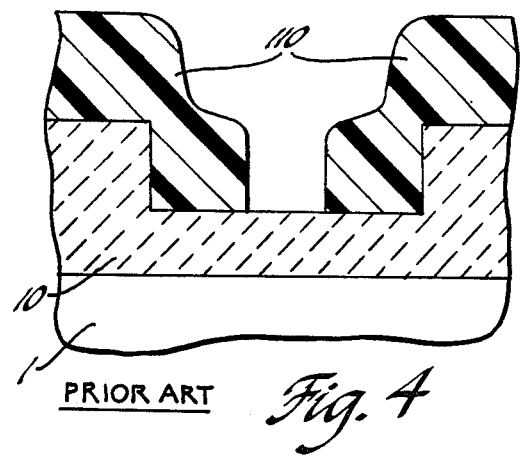
PRIOR ART Fig. 4
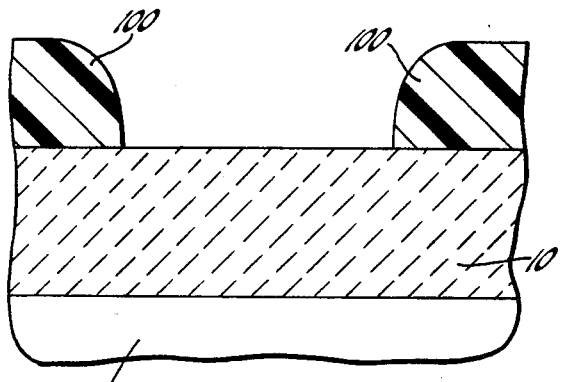
Fig. 2 PRIOR ART
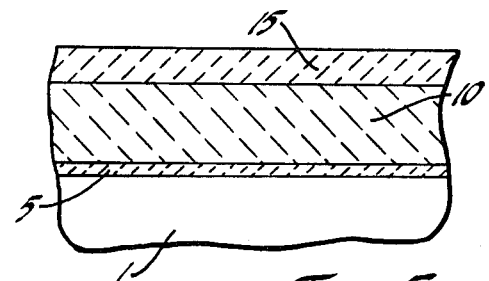
Fig. 5
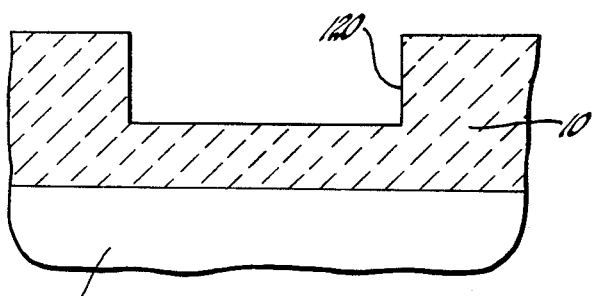
Fig. 3 PRIOR ART
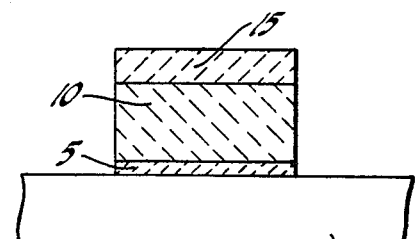
Fig. 6
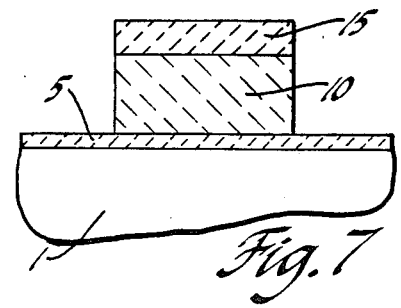
Fig. 7

DOUBLY-SELF-ALIGNED HOLE-WITHIN-A-HOLE STRUCTURE IN SEMICONDUCTOR FABRICATION INVOLVING A DOUBLE LOCOS PROCESS ALIGNED WITH SIDEWALL SPACERS

FIELD OF THE INVENTION

This invention relates to a method for fabricating structures in semiconductor materials, and in particular, to a method for fabricating structures used in silicon integrated circuits.

CROSS REFERENCE

This application is related to three other applications, U.S. Ser. Nos. 939,183; 940,255 and 940,436, entitled respectively, "Method of Fabricating Self-Aligned Silicon-On-Insulator Like Devices", "Method of Fabricating Silicon-On-Insulator Like Devices", and "Semiconductor Mushroom Structure Fabrication" which are being filed concurrently with the present application and in which there is one common inventor and a common assignee.

BACKGROUND OF THE INVENTION

The semiconductor industry is increasing its use of silicon integrated circuits. In particular, there is a demand for silicon-on-insulator structures comprising a "mushroom" shape, i.e. a relatively narrow "stem" of silicon grown through an oxide layer and a silicon "head," of larger lateral dimension than the "stem," grown on top of the stem in such a manner that a portion of its lateral extent is positioned on top of the oxide layer. The concurrently filed U.S. patent application Ser. No. 940,436, entitled "Semiconductor Mushroom Structure Fabrication," by Peter J. Schubert and John C. Christenson, commonly assigned with this application and incorporated by reference herein (referred to hereinafter as Schubert et al), discloses a method for fabricating a "mushroom" shape structure where one embodiment comprises fabricating monocrystalline (single crystal) silicon in a hole-within-a-hole structure like that shown in FIG. 1 herein. In FIG. 1, silicon dioxide layer 10 is formed on silicon substrate 1 and the hole-within-a-hole structure comprises a first, larger hole 120 and a second, smaller hole 130. In one embodiment of the disclosed method, as shown in FIG. 2 herein, photoresist mask 100 is formed on silicon dioxide layer 10. FIG. 3 herein shows the structure formed from the structure shown in FIG. 2 after layer 10 has been partially etched and photoresist mask 100 has been removed to form a first, larger hole 120. FIG. 4 herein shows the structure formed from the structure shown in FIG. 3 after photoresist mask 110 has been formed to allow etching of second, smaller hole 130 shown in FIG. 1. Such a method encounters difficulties in resolving second, smaller hole 130 as its dimensions shrink. Although standard photolithography can resolve small dimensions on a planar surface, the patterning of a small hole in a non-planar topography as shown in FIGS. 2-4 is more difficult.

The difficulties with the conventional, photolithographic method for creating the hole-within-a-hole structure in non-planar topologies arises from two fundamental limitations. A first limitation is that, after a larger, "outside" hole 120 has been created, the resultant topology makes it difficult to reliably pattern smaller, "inside" hole 130. Poor repeatability and reduced reliability in the devices fabricated using this structure occur as a result of reflected light from corners and varying thicknesses of photoresist. A second limitation is that, a slight misalignment is always present when two distinct photolithography steps are used in the same area. Further, the method of creating the hole-within-a-hole shown in FIGS. 2-4 often requires that silicon dioxide layer 10 shown in FIG. 1 be etched back to achieve a desired thickness. This etch-back step is subject to the nonuniformities of the etching system. These nonuniformities are typically plus or minus 5 per cent. As a result, devices such as a Silicon-On-Insulator-Like (SOIL) insulated gate field effect transistor (IGFET) fabricated in this manner may have degraded performance.

Thus, it is desirable to have a method for growing a hole-within-a-hole structure which resolves the smaller hole at small dimensions.

SUMMARY OF THE INVENTION

The present invention provides a method of fabricating a self-aligned hole-within-a-hole structure in a silicon dioxide layer disposed on the surface of a silicon substrate. The inventive method resolves the smaller hole at small dimensions by using a single photolithographic masking step on a planar surface to define the two holes. A preferred embodiment of the inventive method comprises the steps of: (a) fabricating a block of a material on a substrate having the dimension of the smaller hole; (b) fabricating a sidewall spacer surrounding the block, the extent of the block and the sidewall spacer having the dimension of the larger hole; (c) growing a first layer surrounding the sidewall spacer; and (d) removing the sidewall spacer; (e) growing a second layer surrounding the block; and (f) removing the block.

The hole-within-a-hole structure can then be filled with a "mushroom" shape structure of single crystal silicon as shown in Schubert et al by depositing silicon in the smaller hole by selective epitaxial growth, etching back the oxide to expose a "finger" of single crystal silicon, and depositing silicon in the larger hole by a second selective epitaxial deposition. The "mushroom" shape silicon structure can be used to fabricate a Silicon-On-Insulator-Like (SOIL) IGFET, also as shown in Schubert et al.

The present invention is better understood by considering the following detailed description taken in conjunction with the accompanying drawings.

BRIEF DESCRIPTION OF THE DRAWING

FIG. 1 shows a cross-sectional view of a hole-within-a-hole structure;

FIGS. 2-4 show a cross-sectional view of a structure at various stages in the fabrication of a hole-within-a-hole structure using two photolithography steps; and FIGS. 5-13 show a cross-sectional view of a structure at various stages of the fabrication of a hole-with-a-hole structure in accordance with the present invention.

Figure 8:
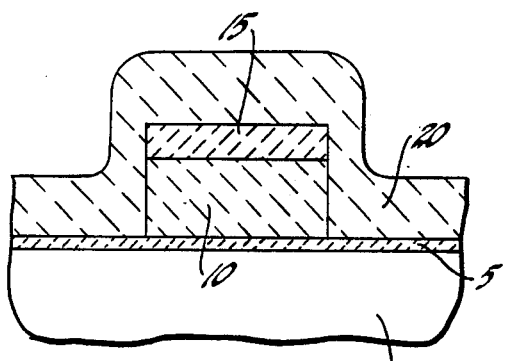

It is to be noted that background lines are omitted and the drawings are not to scale since the vertical dimensions generally are much smaller than the horizontal dimensions.

Moreover, although the method will be used to process a semiconductor substrate (chip) in which a large number of structures will be formed in one sequence of steps, the drawing and the description are generally limited to the fabrication of a single structure.

To facilitate understanding, identical reference numerals are used to designate elements common to the figures.

DETAILED DESCRIPTION

FIG. 5 shows a cross-sectional view of a structure which comprises bare, device-quality n-type or p-type semiconductor body 1, typically a silicon substrate having approximately $1 \times 10^{15}$ impurities per cubic centimeter, with thin silicon nitride ($Si_3N_4$) layer 5 disposed thereon. Substrate 1 is typically monocrystalline (single crystal) silicon having a high resistivity. In the specific example being described, it will be assumed that the doping of substrate 1 is p type, as is characteristic of the more widely used n-channel MOS transistor, and that it is formed from (100) single crystal silicon. Layer 5, approximately 60–80 Angstroms thick, was grown directly on silicon substrate 1 by direct nitridation. Direct nitridation can be achieved in several ways; the most common being to expose bare substrate 1 to a high temperature atmosphere, at approximately 1100° C., of a nitrogen-containing gas, such as ammonia, with no oxygen present.

Layer 10, a relatively thick, approximately 1 micron, layer of silicon nitride was deposited on layer 5 using conventional chemical vapor deposition (CVD) techniques. Then, layer 15, a relatively thin, approximately 1000–2000 Angstroms, layer of silicon dioxide was deposited on layer 10 using conventional CVD techniques. Typically, hundreds or thousands or ten thousands of transistors and other devices will be formed on substrate 1. However, for the sake of convenience the fabrication of a single structure will be illustrated.

FIG. 6 shows a cross-sectional view of a structure fabricated from the structure shown in FIG. 5 by applying well known photolithographic techniques to etch away CVD silicon dioxide layer 15, CVD silicon nitride layer 10, and silicon nitride layer 5 everywhere except where covered by a photoresist (not shown). An appropriate wet etch for CVD silicon dioxide layer 15 is a 10:1 mixture of $H_2O$:HF. It is preferred to etch CVD silicon nitride layer 10 with a plasma etch in order to obtain straight walls. For example, one can use $SF_6$ and argon in the plasma etch.

FIG. 7 shows a cross-sectional view of a structure fabricated from the structure shown in FIG. 6 by a direct nitridation process, for example, exposure to a high temperature ammonia ambient. This regrows thin silicon nitride layer 5 over the exposed portion of silicon substrate 1 where it had been etched off during the nitride etch step used to fabricate the structure shown in FIG. 6.

FIG. 8 shows a cross-sectional view of a structure fabricated from the structure shown in FIG. 7 by depositing thick, for example, one-half micron, conformal CVD silicon nitride layer 20 over the entire structure.

Figure 9:
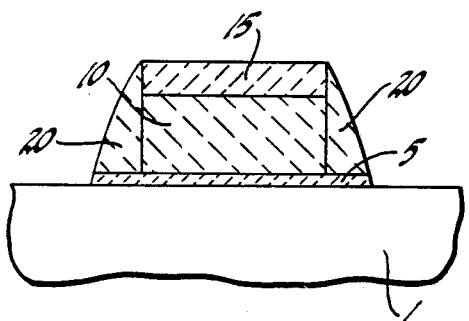

FIG. 9 shows a cross-sectional view of a structure fabricated from the structure shown in FIG. 8 by using an incomplete anisotropic etch, for example, reactive ion etching with $SF_6$ and argon to partially etch away the silicon nitride of layer 20. Because the anisotropic etch etches at a different rate in the vertical and horizontal directions, the resulting structure has the shape shown in FIG. 9, i.e. silicon nitride sidewall spacers 20 appear on the sides of CVD silicon nitride block 10. Note that silicon nitride layer 5 has also been etched to once again expose silicon layer 1. Also note that thin, CVD silicon dioxide layer 15 protected CVD silicon nitride block 10 from the anisotropic nitride etch.

Figure 10:
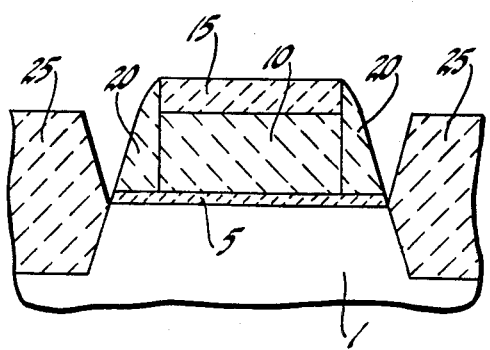

FIG. 10 shows a cross-sectional view of a structure fabricated from the structure shown in FIG. 9 by exposing the structure to a high temperature oxidizing ambient, for example, one atmosphere of oxygen at approximately 950° C. or 15 atmospheres of oxygen at approximately 700° C., to form thick silicon dioxide layer 25 where the bare silicon of substrate 1 was exposed. The surface of the structure covered by silicon nitride layer 5 remains unreacted, and CVD silicon nitride sidewall spacer 20 prevents oxygen atoms from penetrating underneath silicon nitride layer 5. Note that without silicon nitride sidewall spacers 20, thin silicon nitride layer 5 may not be sufficient to prevent oxidation of the silicon beneath it.

Figure 11:
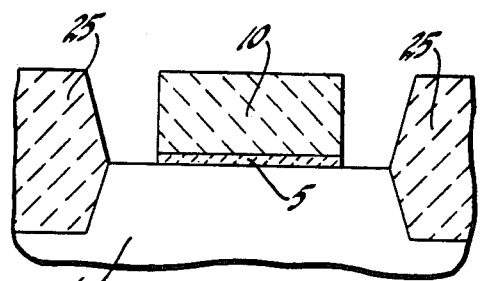

FIG. 11 shows a cross-sectional view of a structure fabricated from the structure shown in FIG. 10 by using an anisotropic etch, for example, reactive ion etching with $SF_6$ and argon to remove silicon nitride sidewall spacers 20 and the portion of silicon nitride layer 5 underlying it to expose the portion of silicon substrate 1 lying thereunder. This was followed by a brief oxide etch with, for example, a 10:1 mixture of $H_2O$:HF to remove thin CVD silicon dioxide layer 15. This step also slightly diminishes thick thermal silicon dioxide layer 25.

Figure 12:
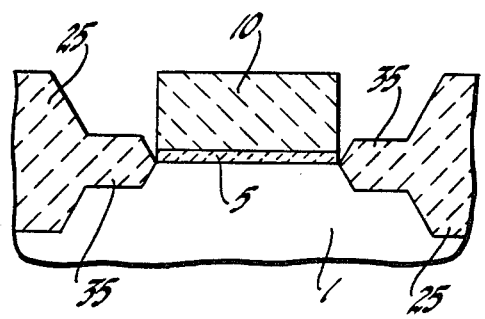
Figure 13:
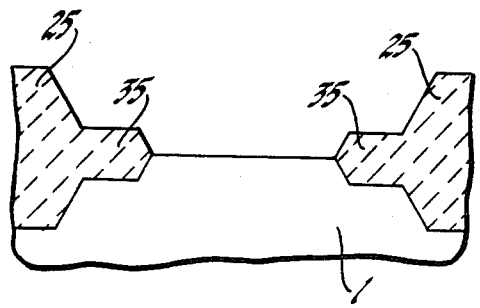

FIG. 12 shows a cross-sectional view of a structure fabricated from the structure shown in FIG. 11 by a second, but shorter, high temperature oxidation. This grows thermal silicon dioxide layer 35 on the exposed silicon of substrate 1. This step is followed by an etch, for example, a wet etch of phosphoric acid and $H_2O$ at approximately 140° C., to remove CVD silicon nitride block 10 and silicon nitride layer 5 beneath block 10 to produce the structure shown in FIG. 13.

In summary, in accordance with the method of the present invention, the larger, "outside" hole of the hole-within-a-hole structure is self-aligned to original CVD silicon nitride block 10 due to the action of sidewall spacer 20. The second self-alignment comes when sidewall spacer 20 is removed and second thermal silicon oxide layer 35 is grown. Layer 35 also aligns itself to original CVD silicon nitride block 10. In this manner, no photolithographic alignment is used, i.e., photoresist is not needed to delineate the pattern, and no etch-back is required to form the desired thicknesses of the silicon dioxide layers. Instead, the thermal oxidation steps define the silicon dioxide layer thicknesses with a typical uniformity of plus or minus 2 per cent. Since the method of the present invention does not depend on photolithography, either for alignment of the holes or the definition of the smaller, "inside" hole, in the presence of the outside hole the critical inside hole will be more uniform and more reliably centered than if it were defined with photoresist. Further, since photolithography is used only to define the dimensions of the inside hole in accordance with the size of CVD silicon nitride block 10, and that step is performed on a planar surface, the inside hole width can be made as small as photolithographic limits allow.

In one application of the present invention, the hole-within-a-hole-structure can be used, in accordance with the method disclosed in Schubert et al, to fabricate a single crystal silicon "mushroom" shape structure and then a SOIL MOSFET. In another application of the structure provided by the present invention, contact windows are produced in silicon dioxide. The stair-like shape of the sides of the hole-within-a hole structure is used to reduce the vertical height that a layer of interconnect metal must cover in one step when extending from silicon to the top of the field oxide. In yet another application of the structure provided by the present invention, a topography in silicon having two steps is useful for reducing channel resistance in a buried channel MOSFET device.

The embodiments described herein are intended to be illustrative of the general principles of the invention. Various modifications are possible consistent with the spirit of the invention. For example, sidewall spacer 20 as illustrated hereinabove was fabricated from CVD silicon nitride. In further embodiments of the present invention, sidewall spacer 20 can be fabricated from silicon dioxide.

The embodiments of the invention in which an exclusive property or privilege is claimed are defined as follows:

1. A method for fabricating a hole-within-a-hole structure on a substrate for purposes of epitaxial deposition of silicon within the holes which comprises the steps of:
providing a substrate of semiconductor material having a major surface;
forming a block on said major surface having a transverse dimension about equal to a transverse dimension of the smaller hole of the hole-within-a-hole structure on the substrate, comprising the steps of:
 (A) depositing a coating of silicon nitride onto said major surface of said substrate,
 (B) depositing a silicon oxide layer onto said silicon nitride coating, and
 (C) patterning said layer of silicon oxide and said coating of silicon nitride so as to form said block on a portion of said major surface;
forming a sidewall spacer surrounding said block, the transverse dimension of said block and said surrounding sidewall spacer being about equal to a transverse dimension of a larger hole, formation of said sidewall spacer comprising the steps of:
 (A) depositing a second coating of silicon nitride onto the exposed portions of said major surface of said substrate not underneath said block,
 (B) depositing a conformal layer of material over said block and said coating, and
 (C) anisotropically etching said conformal layer and said second coating to form said sidewall spacer surrounding said block;
thermally growing a first region of silicon oxide on said major surface of said substrate, so that said thermally grown first region of silicon oxide surrounds said sidewall spacer defining said transverse dimension of said larger hole;
removing said sidewall spacer and underlying second coating of silicon nitride so that said underlying portions of said major surface are exposed;
thermally growing a second region of silicon oxide on said exposed underlying portions of said major surface of said substrate, so that said thermally grown second region of silicon oxide surrounds said block defining said transverse dimension of said smaller hole, the thickness of said second region of silicon oxide being less than the thickness of said first region of silicon oxide; and
removing said block so that said major surface underlying said block is exposed,
said first and second regions of thermally grown silicon oxide extend above and below said major surface of said substrate;
effective to produce a hole-within-a-hole structure suitable for epitaxial deposition of silicon within the holes.

2. The method of claim 1 wherein the substrate comprises monocrystalline silicon and the step of depositing a silicon nitride coating when forming said block of material comprises the steps of:
forming a first layer of silicon nitride, and
forming a second, thicker layer of silicon nitride.

3. The method of claim 1 wherein said anisotropic etching of said conformal layer to form said sidewall spacer comprises reactive ion etching.

4. The method of claim 1 wherein said conformal layer comprises silicon nitride.

5. The method of claim 1 wherein said conformal layer comprises silicon dioxide.

6. The method of claim 4 wherein the step of removing said sidewall spacer and said underlying second coating of silicon nitride comprises anisotropic etching.

7. The method of claim 1 wherein the step of removing said block comprises anisotropic etching.

* * * * *